(12) United States Patent
Bergmann et al.

(10) Patent No.: US 7,863,800 B2
(45) Date of Patent: Jan. 4, 2011

(54) TRANSDUCER OPERATING WITH SURFACE ACOUSTIC WAVES AND HAVING FOUR EXCITATION CENTERS

(75) Inventors: Andreas Bergmann, Haiming (DE); Thomas Ebner, Munich (DE)

(73) Assignee: Epcos AG, Munich (DE)

( * ) Notice: Subject to any disclaimer, the term of this patent is extended or adjusted under 35 U.S.C. 154(b) by 230 days.

(21) Appl. No.: 12/064,859

(22) PCT Filed: Sep. 19, 2006

(86) PCT No.: PCT/DE2006/001661
§ 371 (c)(1), (2), (4) Date: Jul. 15, 2008

(87) PCT Pub. No.: WO2007/033656
PCT Pub. Date: Mar. 29, 2007

(65) Prior Publication Data
US 2008/0278031 A1 Nov. 13, 2008

(30) Foreign Application Priority Data
Sep. 23, 2005 (DE) ........................ 10 2005 045 638

(51) Int. Cl.
*H01L 41/04* (2006.01)
*H03H 9/145* (2006.01)
(52) U.S. Cl. .................................. 310/313 B
(58) Field of Classification Search ............... 310/313 B
See application file for complete search history.

(56) References Cited

U.S. PATENT DOCUMENTS

| | | | | |
|---|---|---|---|---|
| 5,073,763 A * | 12/1991 | Wright | ...................... | 333/193 |
| 5,521,565 A * | 5/1996 | Anemogiannis | ............ | 333/195 |
| 5,663,695 A * | 9/1997 | Tanaka et al. | ................ | 333/193 |
| 5,793,146 A | 8/1998 | Wright | | |
| 5,952,765 A * | 9/1999 | Garber et al. | ............ | 310/313 B |
| 6,011,344 A * | 1/2000 | Dufilie et al. | ........... | 310/313 B |
| 6,127,904 A * | 10/2000 | Tanaka et al. | ................ | 333/193 |
| 6,211,600 B1 * | 4/2001 | Martin | .................... | 310/313 D |
| 6,246,150 B1 * | 6/2001 | Mitobe | .................... | 310/313 B |
| 6,580,199 B2 * | 6/2003 | Mitobe | .................... | 310/313 B |
| 6,710,683 B2 * | 3/2004 | Nakamura et al. | .......... | 333/193 |
| 6,777,855 B2 * | 8/2004 | Bergmann et al. | ...... | 310/313 B |
| 6,960,866 B2 * | 11/2005 | Kando | .................... | 310/313 C |

(Continued)

OTHER PUBLICATIONS

Chang R. E. et al. "Experimental Study on the Performance of Dithered Single-Phase Unidirectional Transducers (DSPUDT) and Their Filter Applications on ST-Quartz and LITAO3 Substrate Materials" IEEE Ultrasonics Symposium, 1996, pp. 5-10.

(Continued)

*Primary Examiner*—J. SanMartin
(74) *Attorney, Agent, or Firm*—Fish & Richardson P.C.

(57) ABSTRACT

A transducer operating with surface acoustic waves is specified, which is divided into cells, whose length essentially equals one wavelength, comprising cells of the second type, which are SPUDT cells and which have an excitation intensity of 100%, and at least one cell of the first cell type, which has at least four excitation centers, wherein an excitation center lies between two adjacent fingers with different polarities, and wherein the cell of the first cell type has an excitation intensity of a maximum of 30%.

15 Claims, 3 Drawing Sheets

U.S. PATENT DOCUMENTS

2002/0167377 A1  11/2002  Tsuruoka et al.
2003/0057805 A1   3/2003  Bergmann et al.

OTHER PUBLICATIONS

Fleischmann B. et al. "Higher Harmonic Surface Transverse Wave Filters" IEEE Ultrasonics Symposium, 1989. pp. 235-239.

Wright. P. V. et al "Single Phase Unidirectional Transducers Employing Uniform-Width Dithered Electrodes" IEEE Ultrasonics Symposium. 1995, pp. 27-32.
International Search Report for PCT/DE2006/001661.
Written Opinion for PCT/DE2006/001661.
English translation of Written Opinion for PCT/DE2006/001661.

* cited by examiner

TRANSDUCER OPERATING WITH SURFACE ACOUSTIC WAVES AND HAVING FOUR EXCITATION CENTERS

CROSS REFERENCE TO RELATED APPLICATIONS

Pursuant to 35 USC §120, this application claims the benefit of PCT/DE2006/001661 filed Sep. 19, 2006 which claims the benefit of German Patent Application No. 102005045638.3 filed Sep. 23, 2005. Each of these applications is incorporated by reference in its entirety.

BACKGROUND

From the publication US 2003/0057805 A1, SPUDT filters (SPUDT=Single Phase Unidirectional Transducer) are known, which are distinguished in that their cells—SPUDT cells—are each constructed for directed emission of the acoustic wave.

SUMMARY

A problem to be solved is to suppress undesired peaks in the stop band of the transfer function of a SPUDT filter.

The acoustic behavior of an electroacoustic transducer can be characterized (locally in the longitudinal direction) by weighting functions (excitation function or reflection function). The weighting functions depend on the longitudinal coordinates and describe the distribution of the excitation or reflection intensity in the transducer. The weighting functions of a transducer can be defined on the basis of the given electrical filter properties. From the calculated weighting function, one can determine the necessary connection sequence and construction of the electrode fingers.

An excitation center is located between two adjacent fingers with different polarities. Two adjacent fingers with different polarities thus form an exciting finger pair. For an alternating sequence of cold and hot fingers, one and the same finger is assigned to two different exciting finger pairs, because on both sides it faces fingers with different polarities. An exciting finger pair can also be formed by terminal, adjacent fingers of a group of hot fingers and a group of cold fingers.

Two excitations with different signs can be spaced apart from each other—with respect to the center frequency of the filter—e.g., by a half wavelength, and two excitations with the same sign can be spaced apart from each other by a whole wavelength. The phase difference between the reflection centers and the excitation centers preferably equals ca. 45° or −45°. The excitation and reflection centers thus usually follow a pattern, but in principle, can deviate from it.

For realizing a transducer geometry whose frequency response corresponds to that of a transducer with continuous weighting functions for excitation and reflection, an omission weighting is used. An omission weighting is understood to be the approximation of continuous weighting functions by the weights of discrete cells. That is, the continuous distribution of excitation and reflection is approximated by a density distribution of exciting and reflecting cells, so that the integral of the excitation and reflection function changes as little as possible. In order to be able to also reproduce small side lobes in the excitation function—especially those whose integral excitation is smaller than the maximum excitation of a cell—in the omission function, it is helpful to use cells whose excitation intensity is significantly below the maximum excitation.

A transducer operating with surface acoustic waves is specified, which includes transducer cells that have electrode fingers and whose length essentially equals a wavelength $\lambda$ at the center frequency of the transducer. At least in one range of the transducer, which has a length $\lambda$, at least four excitation centers are provided.

The transducer is preferably a SPUDT transducer, that is, a transducer in which an acoustic wave is emitted preferably in one direction at the center frequency.

The transducer cells preferably include at least one cell of the first cell type, which has at least four excitation centers. The cell of the first cell type is preferably a SPUDT cell.

The transducer cells also include, in one advantageous variant, the cells of a second cell type, which are SPUDT cells and which have an excitation intensity of 100%. The excitation centers of the cell of the first cell type are distributed, in this variant, such that the excitation intensity of the cell of the first cell type equals a maximum of 30%.

The elementary cell is a minimum unit in which a directed emission of the acoustic wave of the given wavelength is achieved by a corresponding shift between the excitation and reflection centers. An excitation intensity that is relatively small, but not zero, in a cell is advantageous for the implementation of a (continuous) excitation function with small side lobes in one transducer geometry.

A transducer operating with surface acoustic waves or SAW transducer (SAW=Surface Acoustic Wave) usually includes two comb-like electrodes, which have intermeshing electrode fingers. This structure is arranged on a piezoelectric substrate and is used for the electroacoustic conversion of a (high-frequency) electrical signal into an acoustic wave and vice versa.

Through electrical and mechanical discontinuities, a part of the incident acoustic wave is reflected in the reverse direction at each electrode finger. It is assumed that the reflection is localized at a point (reflection center) at which the reflection coefficients of waves running in opposite directions are equal or purely imaginary. On most piezoelectric substrates which feature symmetric, directionally independent properties with respect to reflection, this is the middle of the finger.

The cell of the second cell type is a SPUDT cell in which the phase difference between a reflection center and an excitation center preferably equals 45° or −45° according to the preferred direction of the wave emission. The SPUDT cells are each used for a directed emission of the acoustic wave in a preferred direction. The directed emission is realized through the constructive overlapping of the excited and the reflected waves in one direction or the destructive overlapping of the excited and the reflected waves in the opposite direction.

In the cell of the first cell type, the number and the position of the excitation centers are preferably selected so that, for each cell, opposite-phase excitations are canceled out up to a residual amount, whose intensity is a maximum of 30% of the excitation intensity of the SPUDT cells. In the cell of the first cell type, e.g., the number of fingers, the finger width, and the distance between the fingers can be selected such that opposite-phase excitations are canceled out up to the mentioned residual amount for each cell.

In the cell of the first cell type, at least two arrangements of hot fingers with at least one hot finger for each arrangement can be provided. Each arrangement of hot fingers assigned to the cells of the first cell type is arranged between two arrangements of cold fingers with at least one cold finger for each arrangement. These can be the cold fingers of the same cell. Alternatively, a cold finger of the same cell and a cold finger of the adjacent cells could be assigned.

In an arrangement with several hot fingers, hot fingers follow one after the other. In an arrangement with several cold fingers, cold fingers follow one after the other. Two cold or hot fingers together can form a cold or hot split finger.

A cell of the first cell type preferably includes at least four exciting finger pairs. However, it is also possible to arrange an excitation center on the boundary between the cells of the first cell type and an adjacent cell or so that it belongs to the adjacent cell. In this case, a first finger of the exciting finger pair belongs to the cell of the first cell type and a second finger of this finger pair belongs to the adjacent cell. The adjacent cell can be, e.g., a cell of the first or second cell type.

In one advantageous variant, first and second finger groups are provided in the transducer. The first finger groups each include at least one cold finger and the second finger groups include at least one hot finger, or vice versa. The finger groups, however, can also include several successive fingers connected to the same collector electrode. The fingers of a first finger group are connected to a first collector electrode and the fingers of a second finger group are connected to a second collector electrode of the transducer. The structure with several successive fingers can be advantageous for setting a desired reflection intensity.

In one variant, a cell of the first cell type has at least two first finger groups and at least one second finger group arranged between two first finger groups of this cell. Each first finger group can be arranged between two second finger groups of the same cell. Alternatively, a first finger group of this cell can be arranged between a second finger group of the same cell and a second finger group of an adjacent cell.

In one variant, the cell of the first cell type is formed by a sequence of five fingers which have essentially the same width and which are arranged equidistant and which are connected alternately to the collector rails of different polarities. The distance between two adjacent fingers of the cell of the first cell type is preferably equal to the finger width.

The phase of the total excitation in the cell of the first cell type can essentially equal that in a split finger cell, which is preferably the case for all cells of the first cell type or also for all transducer cells, wherein the same phase position of the exciting wave is then achieved in all of the cells. In contrast, the amount of total excitation in the cell of the first cell type lies at a maximum of 30% of the excitation intensity of the split finger cell.

In the sense of this specification, a split finger cell is understood to be an ideal cell of length $\lambda$, in which each finger is arranged between a finger with the same potential and a finger with the opposite potential. In the split finger cell, an acoustic wave can be excited, whose nodes lie in the middle between the adjacent fingers lying at the same potential. The split finger cell is, e.g., a cell of length $\lambda$, in which four equal-width fingers of the width $\lambda/8$ are provided. The fingers of such a cell are arranged equidistantly. The SPUDT transducer can have at least one split finger cell.

The cell of the first cell type can be a cell that excites and reflects the acoustic wave, wherein the phase difference between an excitation center and a reflection center is, i.e., essentially 45° or −45°, like for the cells of the second cell type. The phase difference between a reflection center and an excitation center in the cell of the first cell type equals 45° or −45° in an advantageous variant.

The position of the reflection centers can be selected by setting finger widths and distances in the cell of the first cell type, such that the sum of the reflection amounts in this cell is essentially equal to zero. Thus, the cell of the first cell type can be a cell that excites the acoustic wave but does not reflect it. The latter is realized in that the waves reflected at various fingers of the cells of the first cell type cancel each other out within this cell.

In a SPUDT transducer, several cells of the first cell type with various properties explained above or with different excitation intensities can be provided.

The specified transducer will now be explained with reference to schematic figures that are not true to scale. Shown are:

DETAILED DESCRIPTION

Figure 1:
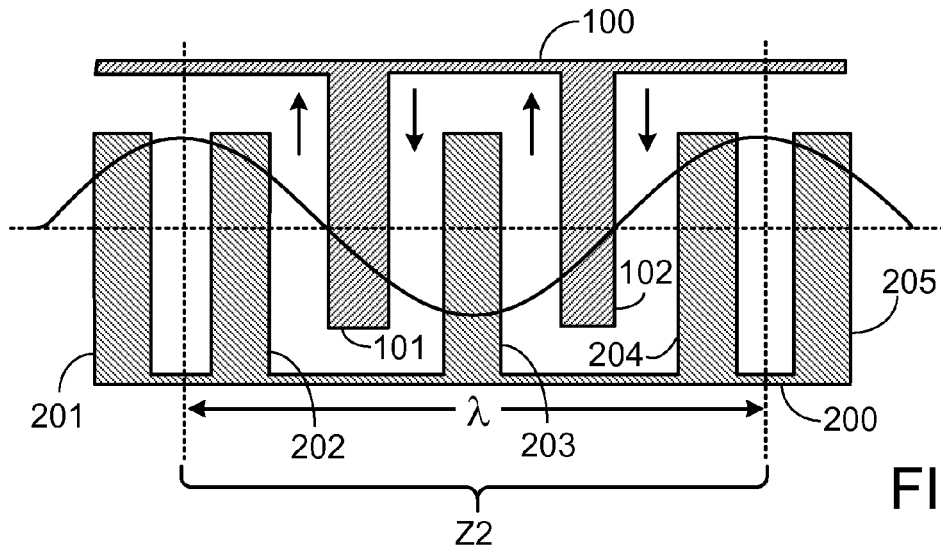
FIG. 1, a cell of the first cell type with five electrode fingers, which has a very low excitation intensity.

FIG. 1 shows a section of a SPUDT transducer in the area of the cell Z2 of the first cell type with a sequence of five fingers, which have equal width and which are connected alternately to the first electrode 100 and the second electrode 200. The fingers 101, 102 are connected to the first electrode 100 and the fingers 201-205 are connected to the second electrode 200.

For example, the electrode 100 is "hot" and the electrode 200 is "cold." In another variant, the hot and the cold electrodes can be exchanged with each other.

It is possible to replace a relatively wide, hot finger, e.g., the finger 101 or 102 in FIG. 1, by a split finger, i.e., by two thinner sub-fingers, which then form an arrangement of successive hot fingers. Between two adjacent fingers of opposite polarity there is an excitation center. An excitation center, where the acoustic wave is excited locally, is characterized by an arrow, with the arrow direction indicating the sign of the local excitation.

In contrast, no excitation takes place between two adjacent fingers attached to the same electrode, e.g., the fingers 201 and 202 or 204 and 205 in FIG. 1.

The distance between two fingers 202 and 101, 101 and 203, 203 and 102, 102 and 204 can be essentially equal to the finger width. Here, two equally large excitations of nearly opposite phase are coupled into the acoustic wave, so that summing the excitation amounts in the cell Z2 produces an excitation intensity of nearly zero. In one variant, the finger widths can be changed, wherein an arbitrarily small excitation intensity of the cell Z2 can be set.

FIGS. 2-6 show different cells of the first cell type, which each have, in terms of magnitude, 20% of the excitation intensity of a split finger cell and the same phase of excitation as the split finger cell. The finger widths and distances in the cells were optimized for $LiNbO_3$ 127.86° YX as the piezoelectric substrate.

Figure 2:
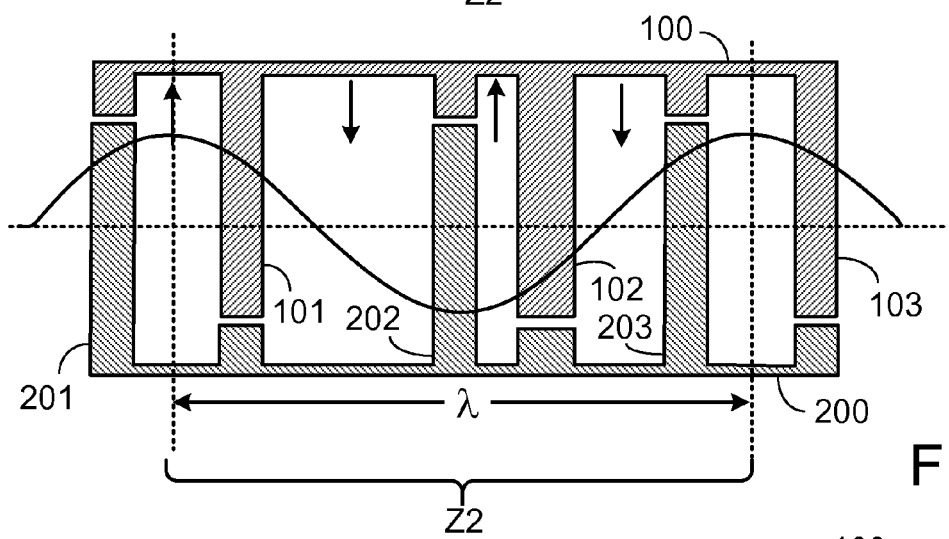
FIGS. 2 and 3, each another cell of the first cell type, which has 20% of the excitation intensity of a split finger cell, wherein a directed emission of the wave is achieved.
Figure 3:
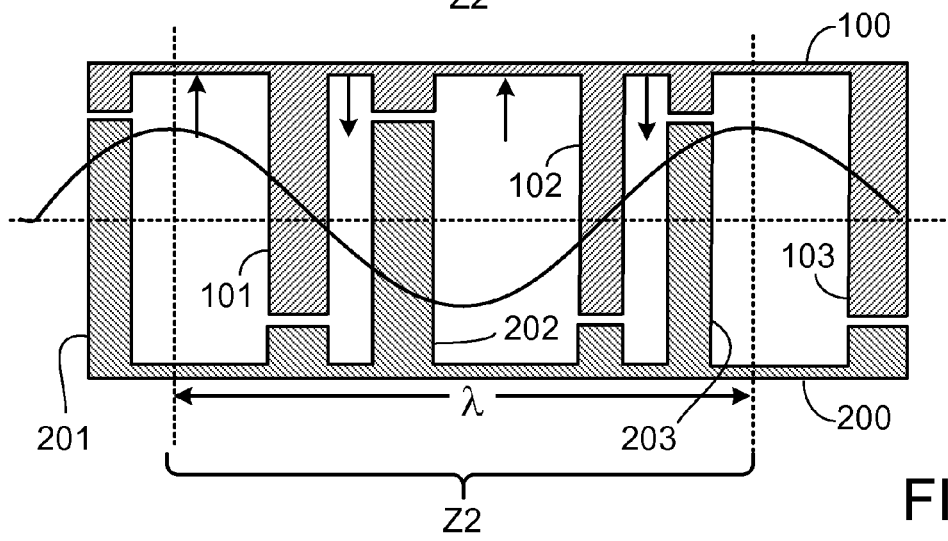

The finger widths and distances in the cell of the first cell type are selected in the examples according to FIGS. 2 and 3 so that a reflection center is shifted by +45° or −45° relative to an excitation center, wherein a maximum emission of the acoustic wave with the wavelength $\lambda$ is produced to the right or to the left.

In the variants according to FIGS. 2 and 3, four fingers with different widths are provided for each cell Z2, wherein the distances between the adjacent fingers 101 and 202, 202 and 102, 102 and 203 are different.

Figure 4:
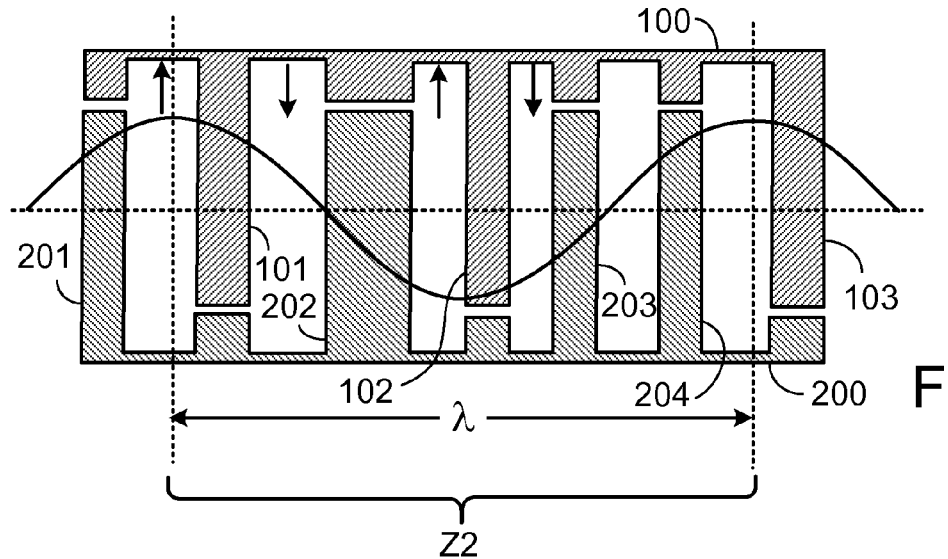
FIGS. 4, 5, and 6, each another cell of the first cell type, which has 20% of the excitation intensity, wherein the reflection amounts are canceled out.
Figure 5:
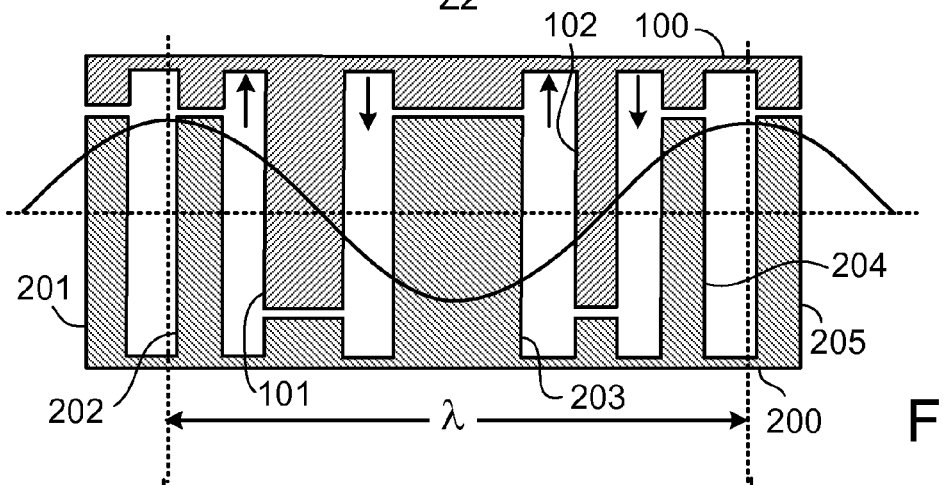
Figure 6:
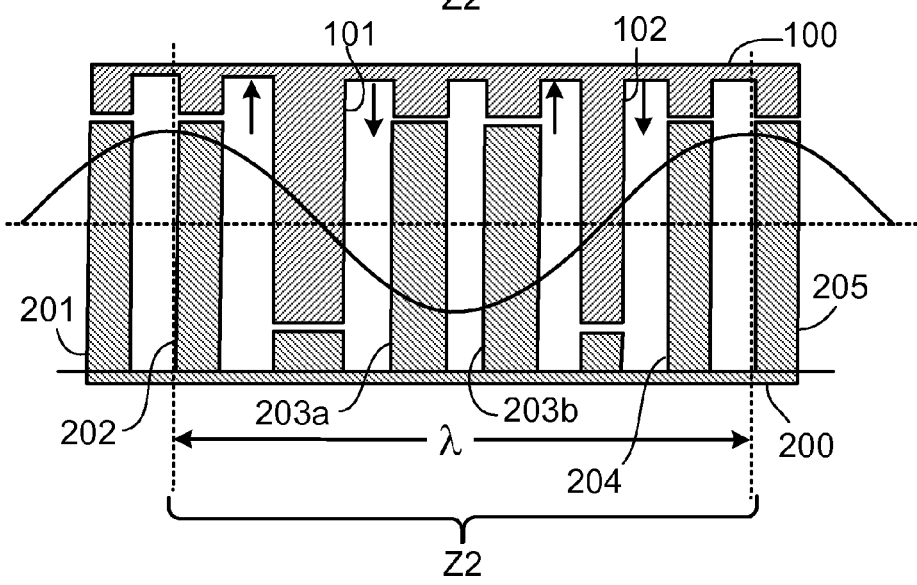

In the variants according to FIGS. 4 and 5, five fingers with different widths are provided for each cell Z2, and in the variant according to FIG. 6, six fingers with different widths are provided for each cell. The fingers 203*a* and 203*b* in FIG. 6 form an arrangement of successive fingers that corresponds to the wide finger 203 in FIG. 5.

The finger widths and distances in the cell of the first cell type are selected in the examples according to FIGS. 4, 5, and 6, so that the sum of all reflection amounts in this cell is equal to zero.

In the variants according to FIGS. 1-6, four local excitations, i.e., excitation centers, are provided for each cell Z2. However, in principle, several excitation centers could also be provided for each cell.

Figure 7:
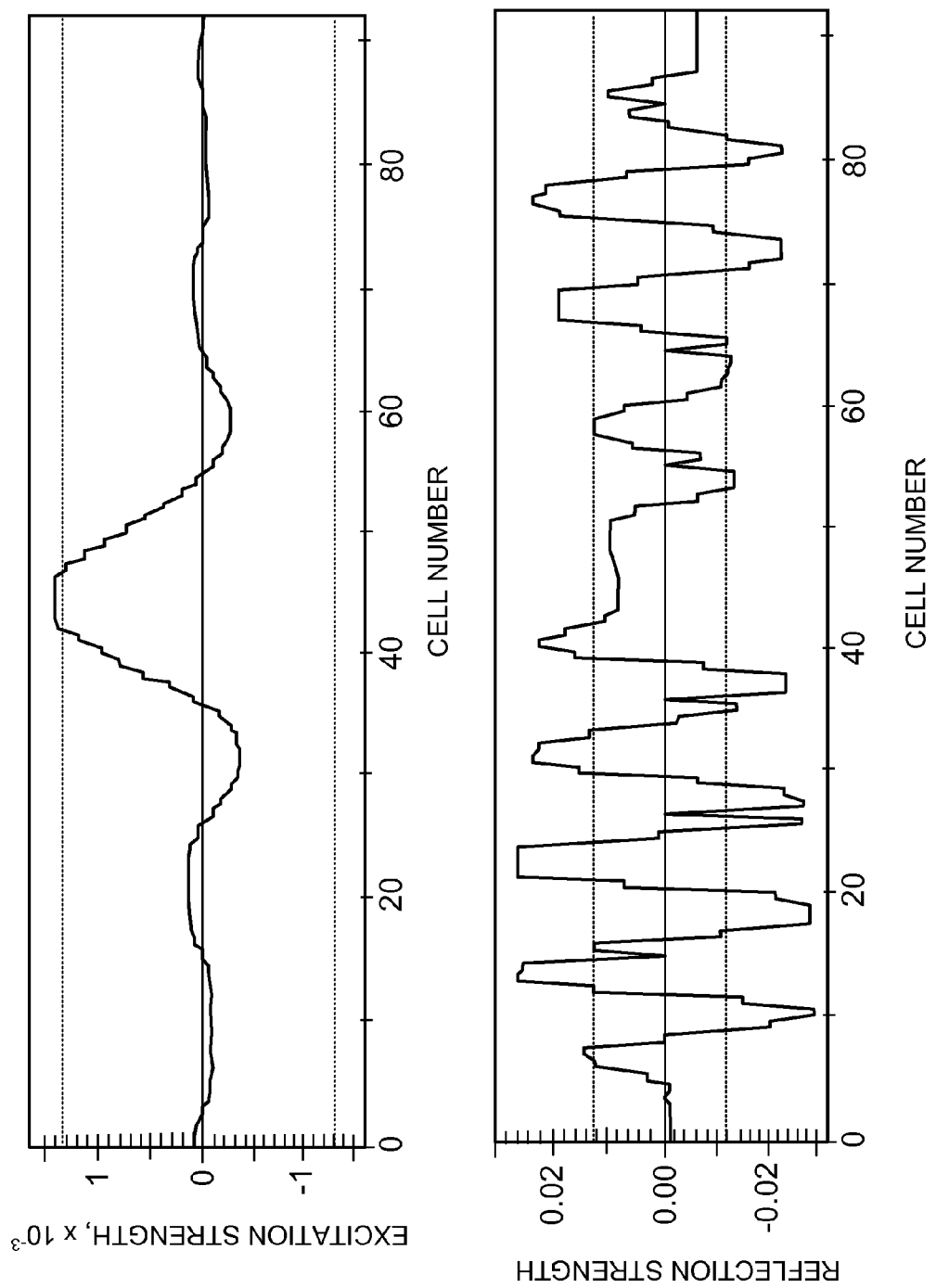
FIG. 7, the continuous excitation function and the reflection function of a SPUDT transducer.

FIG. 7 shows a continuous excitation function (top) and a continuous reflection function (bottom) of a SPUDT transducer. For conversion into a geometry, these functions must be sampled as precisely as possible by the weighting of the excitation intensities of individual cells. For small side lobes of the excitation, the cells Z2 of the first cell type are helpful.

Through the use of cells Z2 of the first cell type in addition to the cells of the second type (SPUDT cells not shown in the figures), it is possible to sample the secondary extremes of the excitation function significantly more precisely than with only cells of the second type.

The SPUDT cells can be arbitrary cells with the emission of the acoustic wave in a preferred direction. In a transducer, various SPUDT cells can be different from each other.

The invention claimed is:

1. A transducer configured for use with surface acoustic waves, the transducer comprising:
    one or more transducer cells including electrode fingers and having an excitation center between two adjacent fingers with different polarities, the one or more transducer cells comprising:
    at least one cell of a first cell type, the at least one cell having a length of about one wavelength at the center frequency of the transducer and having at least four excitation centers.

2. The transducer of claim 1, wherein the at least one cell of the first cell type comprises a single phase unidirectional transducer cell.

3. The transducer of claim 2, wherein the transducer cells include at least one cell of a second type, the at least one cell of the second type comprising a single phase unidirectional transducer cell having a relative excitation intensity of about 100%.

4. The transducer of claim 3, wherein the at least one cell of the first cell type has a relative excitation intensity of at most about 30% based on the number and the position of the excitation centers.

5. The transducer of claim 3, wherein a number of fingers, finger width, and distance between the fingers of the cell of the first cell type are configured to cancel opposite-phase excitations up to a residual amount and an intensity of the at least one cell of the first type is at most about 30% of the excitation intensity of the at least one cell of the second type.

6. The transducer of claim 1, wherein the cell of the first cell type comprises at least two arrangements of cold fingers with at least one cold finger for each arrangement and at least two arrangements of hot fingers with at least one hot finger for each arrangement.

7. The transducer of claim 1, wherein a phase of the total excitation in the at least one cell of the first cell type is about equal to a phase of excitation in a split finger cell.

8. The transducer of claim 1, wherein the at least one cell of the first cell type has at least one reflection center and a phase difference between the reflection center and an adjacent excitation center is about 45° or −45°.

9. The transducer of claim 8, wherein the phase difference between the reflection center and the excitation center is within about 10% of 45° or −45°.

10. The transducer of claim 1, wherein finger distances and widths in the at least one cell of the first cell type are configured such that a phase of the total excitation of the at least one cell of the first cell type corresponds to the excitation of a split finger cell and an the excitation intensity of the at least one cell of the first cell type is at most about 30% of an excitation intensity of the split finger cell.

11. The transducer of claim 3, wherein, in the at least one cell of the first cell type comprises excitation centers distributed such that a relative excitation intensity of the at least one cell of the first cell type is at most about 30%.

12. The transducer of claim 4, wherein opposite-phase excitations for the cell are canceled out up to a residual amount and the intensity of the cell equals a maximum of 30% of the excitation intensity of the at least one cell of the second type.

13. The transducer of claim 6, wherein each arrangement of hot fingers is arranged between two arrangements of cold fingers.

14. The transducer of claim 13, wherein in an arrangement including several hot fingers, the hot fingers follow one after the other.

15. The transducer of claim 13, wherein in an arrangement including several cold fingers, the cold fingers follow one after the other.

* * * * *

UNITED STATES PATENT AND TRADEMARK OFFICE
CERTIFICATE OF CORRECTION

| | | |
|---|---|---|
| PATENT NO. | : 7,863,800 B2 | Page 1 of 1 |
| APPLICATION NO. | : 12/064859 | |
| DATED | : January 4, 2011 | |
| INVENTOR(S) | : Andreas Bergmann et al. | |

It is certified that error appears in the above-identified patent and that said Letters Patent is hereby corrected as shown below:

Claim 10, Column 6, Line 30 – delete "an the" and insert -- an --, therefor.

Abstract – delete "A transducer operating with surface acoustic waves is specified, which is divided into cells, whose length essentially equals one wavelength, comprising cells of the second type, which are SPUDT cells and which have an excitation intensity of 100%, and at least one cell of the first cell type, which has at least four excitation centers, wherein an excitation center lies between two adjacent fingers with different polarities, and wherein the cell of the first cell type has an excitation intensity of a maximum of 30%."

and insert -- A transducer is configured for use with surface acoustic waves. The transducer includes one or more transducer cells including electrode fingers. The transducer cells have an excitation center between two adjacent fingers with different polarities. The transducer cells include at least one cell of a first cell type that has a length of about one wavelength at the center frequency of the transducer and has at least four excitation centers. --, therefor.

Signed and Sealed this
Twenty-fifth Day of October, 2011

David J. Kappos
*Director of the United States Patent and Trademark Office*